United States Patent [19]
Rowlette, Sr.

[11] Patent Number: 5,129,833
[45] Date of Patent: Jul. 14, 1992

[54] LOW-FORCE, HIGH-DENSITY GEL CONNECTOR

[75] Inventor: John R. Rowlette, Sr., Clemmons, N.C.

[73] Assignee: AMP Incorporated, Harrisburg, Pa.

[21] Appl. No.: 721,054

[22] Filed: Jun. 26, 1991

[51] Int. Cl.⁵ .............................................. H01R 9/09
[52] U.S. Cl. ....................................... 439/91; 439/178
[58] Field of Search ............... 439/66, 74, 91, 178, 439/179, 591

[56] References Cited

U.S. PATENT DOCUMENTS

| | | | |
|---|---|---|---|
| 4,705,205 | 11/1987 | Allen | 439/91 |
| 4,770,641 | 9/1988 | Rowlette | 439/86 |
| 4,874,721 | 10/1989 | Kimura | 29/830 |
| 4,926,549 | 5/1990 | Yoshizawa et al. | 439/66 |
| 5,037,312 | 8/1991 | Casciotti | 439/91 |

Primary Examiner—Neil Abrams

[57] ABSTRACT

A connector assembly (10) for electrically interconnecting a component (20) to a circuit (12) includes a housing (50) containing the component with conductive pads (22) of the component and conductive pads (14) of the circuit aligned with a connector (30) including a flexible film (34) carrying contact pads (38, 40) interconnected by a conductive material (42) in a hole (36) and carrying conductive gel contacts (44, 46) which project above and below the film surface to be compressed upon housing closure to drive the said component against the said film and circuit to thus minimize contact forces.

11 Claims, 3 Drawing Sheets

LOW-FORCE, HIGH-DENSITY GEL CONNECTOR

This invention relates to a low-force, high-density connector featuring conductive gel contact points in an array to interconnect component packages to component circuits.

BACKGROUND OF THE INVENTION

U.S. Pat. No. 4,770,641, granted Sep. 13, 1988, describes a conductive gel interconnection apparatus useful to interconnect pin grid arrays or other components having closely spaced conductors with the conductive traces of circuits such as on printed circuit boards. The patent teaches a particular type of conductive gel which, while conforming to housing cavities in which it is used, is sufficiently coherent and viscous that it will not flow from the cavity location and will maintain its original shape when removed from contact with a component.

U.S. patent application Ser. No. 07/613,195 filed Nov. 15, 1990 is drawn to an area array connector utilizing conductive gel in conjunction with a deformable elastomer defining the gel cavities. The elastomer is compressed by the component against a circuit and is caused to flow to effect a gel interconnection. U.S. patent application Ser. No. 07/698,744, and assigned to the assigned hereof, represents an alternative and improvement upon this latter application by utilizing a sheet of material of a relatively low thermal coefficient of expansion containing inserts which house gel defining contact locations. This latter application facilitates interconnection of large numbers of contacts spread in an array fashion and minimizes tolerance problems caused by differential expansion and contraction of the connector relative to the components and circuits being interconnected.

In these latter applications, an interconnection is effected by compression of an elastomer to cause a gel contained in a cavity in the elastomer to flow and interconnect to opposing contact surfaces. The bulk of the force required to cause such interconnection is due to the compression of the elastomer, the relative hardness thereof, and very little due to the force required to cause the gel to flow and make contact. The forces required per contact are, in the foregoing applications, relatively low compared to traditional contacts but are nevertheless substantial when the numbers of contacts in an array exceed 100 and, as is frequently the case, many hundreds in a single connector array.

The present invention has as an object the provision of a low-force, high-density connector array wherein large numbers of contacts are simultaneously interconnected. The invention has as a further object the provision of an interconnection wherein the force of closure and deformation of a gel is due to the characteristics of the gel itself and not the elastomer carrying the gel. The invention has as yet a further object the provision of a multiple contact array connector wherein large numbers of closely spaced gel contacts can be laid down by standard silkscreen and/or stenciling processes to reduce the cost of manufacture while facilitating the manufacture of a precision part.

SUMMARY OF THE INVENTION

The present invention achieves the foregoing objectives by employing a thin flexible film of dielectric material having contact pads on either side thereof located on centerlines compatible with the contact pads of components and circuits to be interconnected, with the pads suitably plated and with plated-through holes extending between such pads. Gel contacts are deposited on such pads to extend within the plated-through holes as by stenciling or silkscreening; the gel contacts being cured on one side of the film prior to deposition of the gel contacts on the other side of the film which is subsequently cured as well. The electrical interconnection between the gel contacts on each side of the film is made through a broad area contact with the pads and extended through the film by the plated-through hole material to achieve a relatively low resistance path. The film containing the gel contacts is placed in a holder forming a connector which is operable to precisely position a component such as a land grid array and the arrays of contacts thereof relative to the film and its contacts and relative to contact pads on a circuit such as a printed circuit board. The connector includes means to clamp the assembly of gel connector and component against the surface of the board to cause the gel contacts to be deformed and result in a broad area of contact with the component contacts and circuit contacts interconnected thereby.

IN THE DRAWINGS

DETAILED DESCRIPTION OF THE INVENTION

Figure 1:
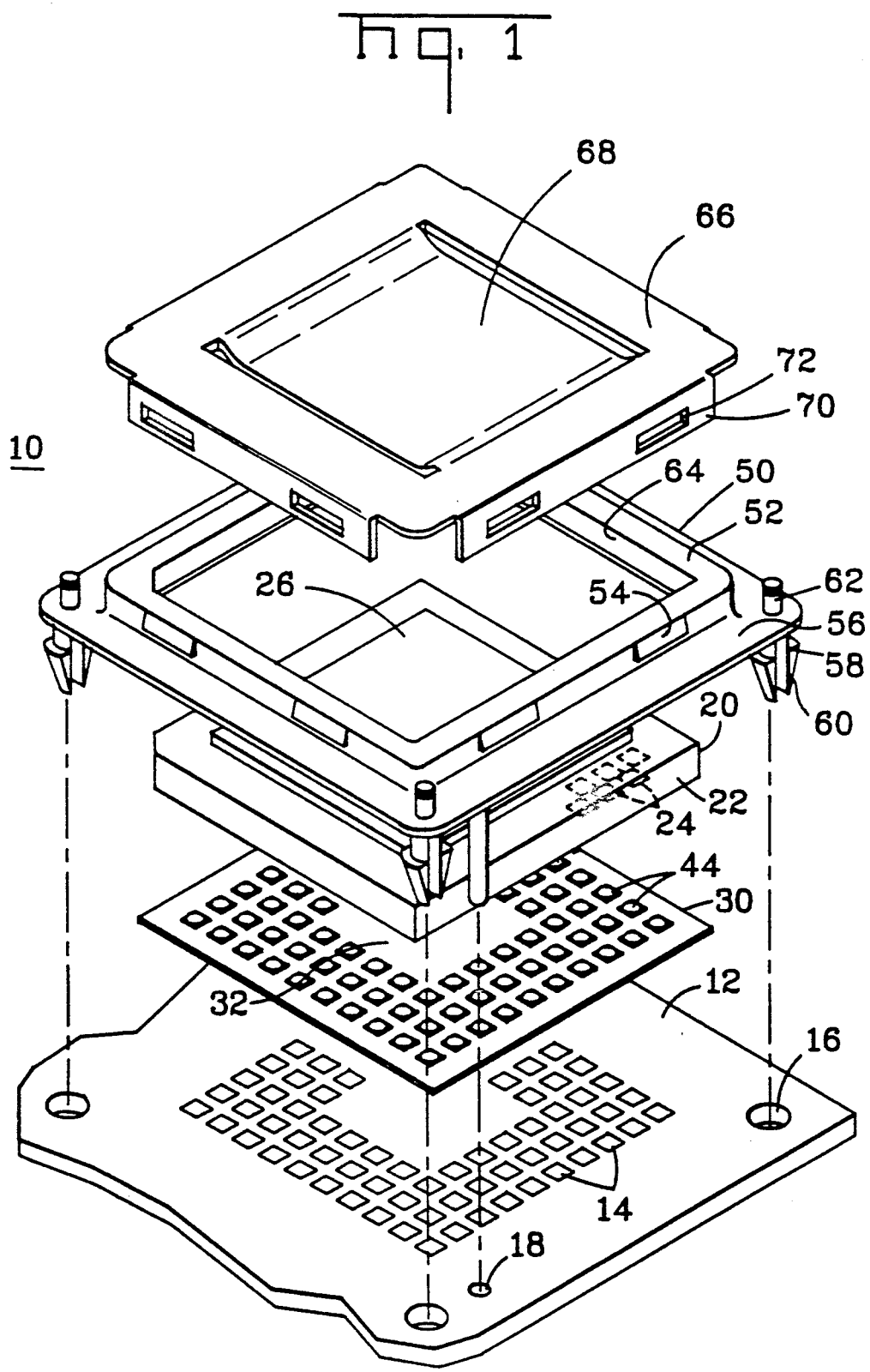
FIG. 1 is a perspective, with the elements exploded to show the relationship between component, gel connector, and circuit board.

Referring now to FIG. 1, an assembly 10 includes a circuit 12, a component 20, and a gel connector 30 which are caused to be interconnected by a connector housing 50 including a cap 66. The purpose of the assembly 10 is to cause an interconnection between the circuits carried within 12 and circuits within 20 to effectively interconnect devices contained within 20 to those of other components to form a functioning electronic device such as a computer, communications system, business machine or the like.

Circuit 12 includes an array of contact pads 14 carried on the upper surface thereof and interconnected to circuit traces in layers within 12, not shown. Circuit 12 includes, at the periphery, mounting holes 16 and guide holes 18 which align the structure shown in FIG. 1 above circuit 12 so that the various contact pads are properly mated. The component 20 may be considered to be an integrated circuit in the form of a land grid array having a body 22 of ceramic, glass, plastic or the like carrying therewithin the various functional devices interconnected to a series of conductive pads 24 on the bottom surface of 22 which are arrayed and in alignment with the pads 14 of the circuit. The housing 22 typically carries a flat planar conductive material 26 which serves as a heat sink for the component.

Also shown in FIG. 1, disposed between the circuit 12 and the component 20, is a connector 30 which, in this embodiment, is comprised of a thin sheet of insulating and dielectric material, preferably flexible, which contains a series of gel contacts disposed in an array on centers to complement the contact pads 14 and contact pads 24 and to interconnect such pads when the assembly is clamped together.

Figure 2:
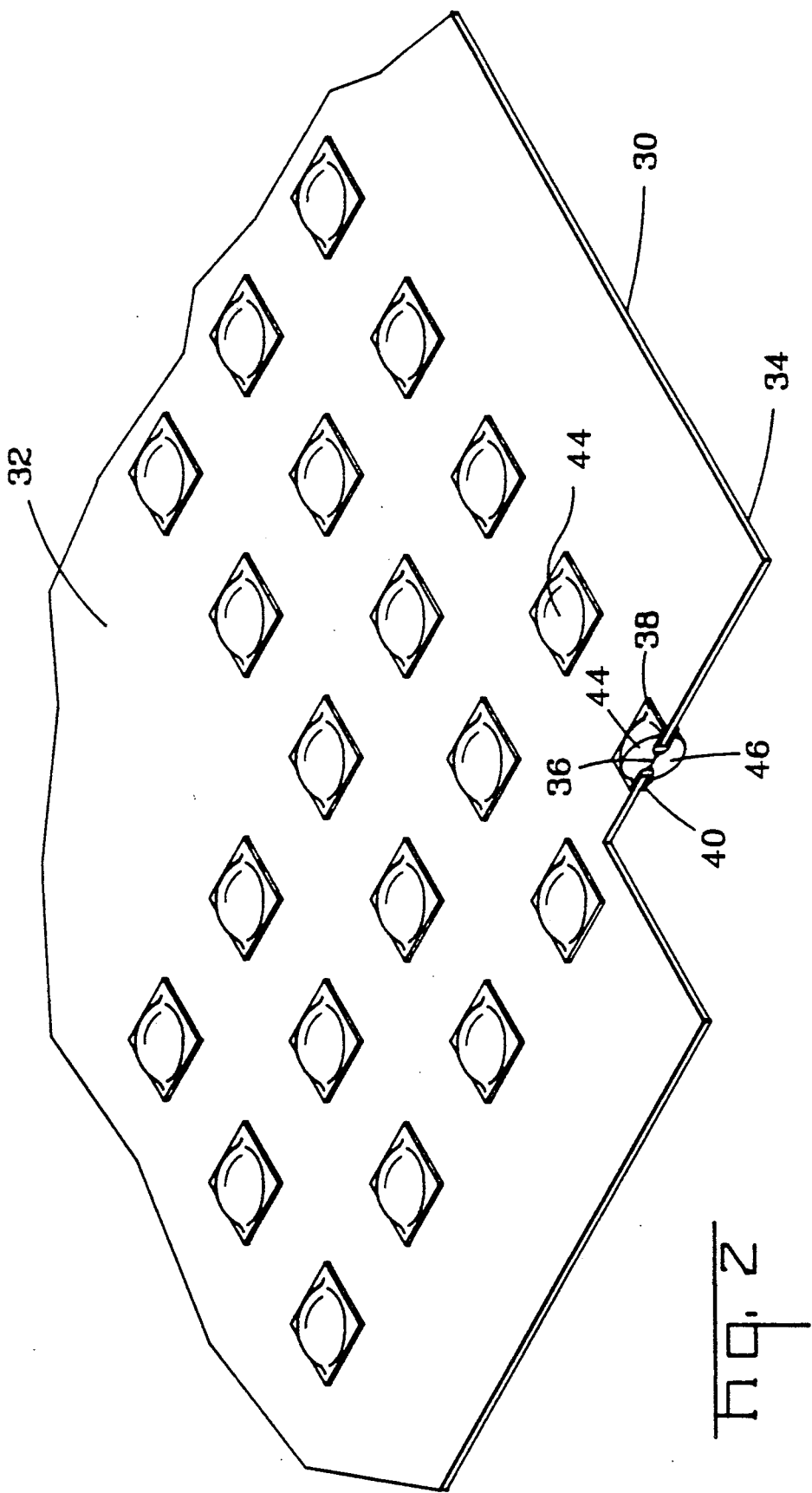
FIG. 2 is a perspective of the gel connector, partially sectioned to show the interior of the gel contact.
Figure 3:
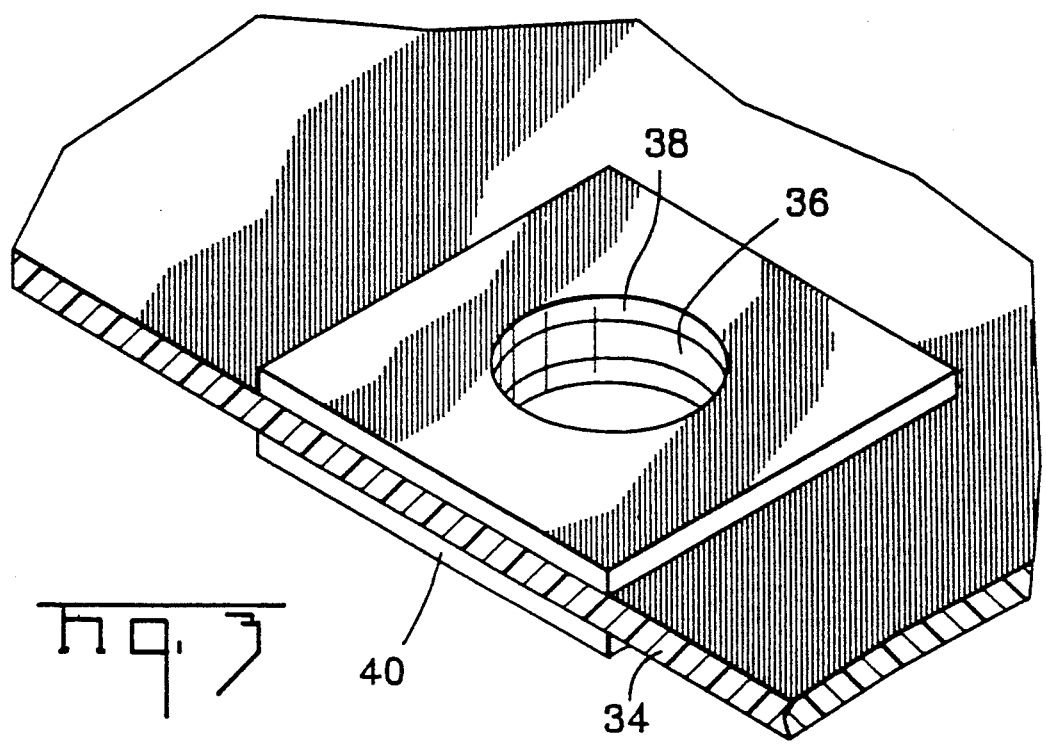
FIG. 3 is a perspective of a single contact of the gel connector of FIG. 2 prior to the application of the plated-through hole material and the gel material.
Figure 4:
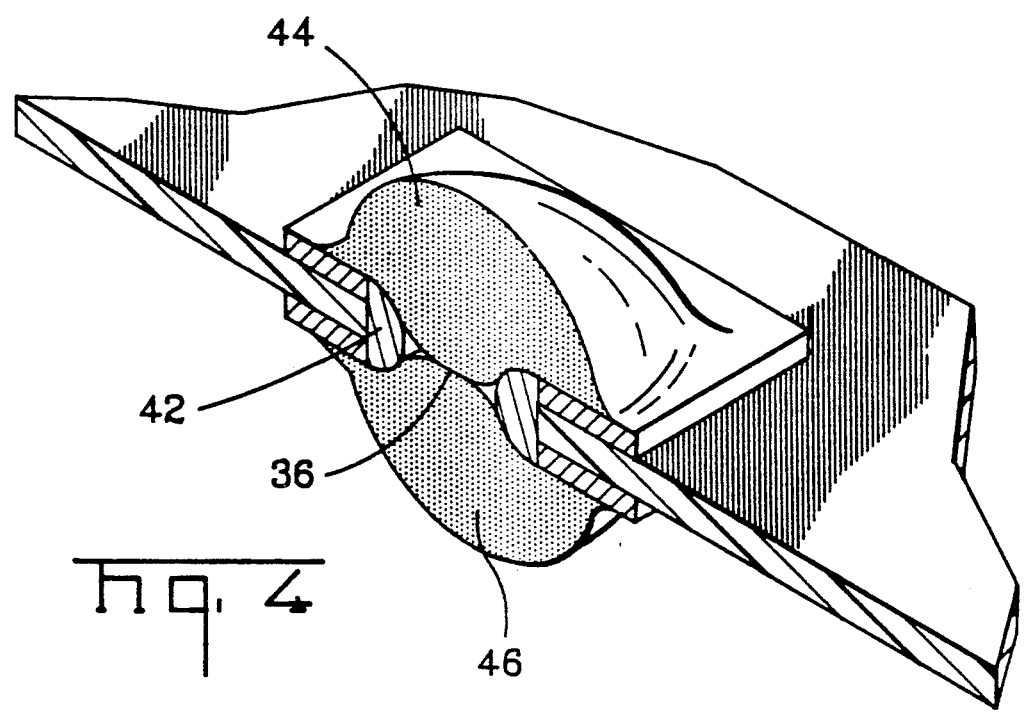
FIG. 4 is a perspective, partially sectioned, showing the gel contact of FIG. 2 following application of the plated-through hole material and the gel.

FIG. 2 shows the connector 30 in more detail to include a center region 32 which is clear of gel contacts, there being a lack of contacts in both the circuit and the component in the center region. Connector 30 includes the film 34 which contains a series of holes 36 therein as shown in FIGS. 2-4. Surrounding each hole on each side of film 34 are conductive pads 38 and 40, typically of a copper material plated with nickel and gold to define a non-corrosive, low-resistance surface. As can be seen in FIG. 4, the holes 36 are plated through as at 42 to effectively, electrically interconnect the pad 38 to the pad 40 for each contact. To provide coxtext, the film 34 was a polyamid film on the order of between 0.003 and 0.005 inches in thickness, the pads 38 and 40 formed of one ounce copper material on the order of 0.0015 inches in thickness, plated with 150 microns of nickel and 30 to 50 microns of gold over the nickel. The contacts of 30, including the holes 36, were on 0.050 inch centers with the holes 36 being on the order of 0.020 to 0.030 inches in diameter.

Referring to FIGS. 2 and 4, in accordance with the invention, the holes 36 are made to contain gel contacts 44 and 46 which, as can be seen, extend well above and well below the surfaces of film 34. The invention contemplates having the gel contacts each on the order of 0.008 inches in height. In use, the gel contacts 40 and 44 are compressed to form a broad area of contact with the contact pads of the component and the circuit. Following compression in accordance with the invention, the gel contacts would have a height on the order of 0.010 to 0.012 inches in thickness representing the degree of compression.

Further in accordance with the invention, a connector housing 50 is provided as shown in FIG. 1 which includes vertical side walls 52 carrying latches 54 on the vertical surfaces thereof and a flange 56 projecting out from the side walls 52. The flange 52 contains, at the corners, fasteners 58 which are beveled as at 60 to fit through the holes 16 in the circuit 12 and latch the housing to the circuit. Projections 62 integral with the fasteners operate to transmit the load of insertion to the fasteners independent of the component 20 and connector 30. An interior relief 64 is dimensioned to receive the component 20 and the connector 30. A cap 66 is provided which includes an interior portion 68 which bears against the planar metal heat sink 26 of component 20 when the assembly is put together. Cap 66 further includes vertical side portions 70, each including apertures 72 of a geometry and position to engage the latches 54 on housing 50. The assembly 10 is put together with the component 20 and the connector 30 aligned within housing 50 and with the cap 66 driven downwardly so that the outside corner edges drive the fasteners through an engagement through 62 into the holes 16, the fasteners camming inwardly and then expanding radially outwardly to latch the housing to the circuit. The latches 54 engage the apertures 72 and hold the cap tightly to the assembly, driving the component downwardly so that the pads 24 engage the gel contacts 44 which in turn conduct through to the gel contacts 46 and to the pads 14 to interconnect the circuits of the component to the circuit 12.

As can be discerned from FIG. 4, the principal resistance path through a given contact is from one gel contact, such as 44, to the conductive structure formed by pads 38 through hole plating 42 and pad 40 into the gel contact 46. As can be discerned, there is a broad area of contact between the gels and the conductive surfaces of the pads. There would typically be a path from gel contact 44 to gel contact 46 within the hole 36, but this resistance path is not critical, the other path through the conductive structures being far more conductive.

The invention contemplates depositing the gel contacts 40 and 46 through the use of a stencil or silkscreen wherein a sheet of material is perforated with holes on centers corresponding to the pads 38 and 40, such holes being loaded with gel caused to flow through the silkscreen or stencil as by doctor blade to be deposited on a given pad 38. Thereafter, the gel is cured thermally to form the contact 44 and the process is repeated with respect to the use of a stencil or silkscreen and the deposition of material forming contact pads 46 on the opposite side of the film 34. So called two-stage silicon materials filled with conductive material to a degree to make the contacts conductive are employed. In accordance with the invention, the durometers of the material utilized for contacts 44 and 46 may be somewhat higher than in the previously mentioned patent applications. Thus for example, the durometers may be on the order of 50 on the Shore A scale rather than 40 as previously mentioned; the invention contemplating a range of hardness for the gels employed.

In use, the lack of planarity of either the contact pads 14 on circuit 12 or the pads 24 on component 24, sometimes varying several thousandths of an inch, can readily be accommodated by the thickness of contacts 44 and 46, the flexibility of film 34 and the broad area of contact with the gel contacts due to compression.

I claim:

1. A connector for electrically interconnecting the conductive pads of a component to the conductive pads of a circuit wherein said pads are arranged in a given planar array, the connector including a thin flexible insulating film having an array of conductive pads on each surface thereof compatible with the pads in said planar array, means electrically joining the pads of the top surface to the pads of the bottom surface of said film, a conductive gel contact disposed on each film pad extending out from the film surface and operable upon compression in an axial sense transverse to the film surface to interconnect the component and circuit pads through the film pads and said means.

2. The connector of claim 1 wherein the said gel contacts each extend outwardly of the film in an axial thickness equal to or substantially greater than the thickness of said film.

3. The connector of claim 1 wherein the said gel contacts engage the pads on said film throughout an area of contact appreciable relative to the area of the pad disposed on the surface of said film.

4. The connector of claim 1 wherein said means electrically joining the pads of the top surface to the pads of the bottom surface of said film is comprised of a hole and a plating through said hole.

5. The connector of claim 4 wherein the said gel contacts extend within the said hole.

6. An assembly for interconnecting the conductive pads of a component to the conductive pads of a circuit wherein said pads are on given centers, in arrays defining high density interconnection patterns, the said assembly comprising a housing receiving a component including means to mount the said component on the said circuit with the said conductive pads of component and circuit aligned on the given centers, a connector formed of a film having on each side surface thereof conductive pads in an array on said given centers aligned with the pads of the component and the circuit, holes in said film including a plating interconnecting the conductive pads on one side portion of said film to those on the other side portion and a contact gel on each conductive pad extending in said holes with the said contact gel further extending out from the surface of the said film to facilitate compression thereof, said means to mount said component operating to receive said connector between said component and said circuit and compress the said component against the said connector and the said circuit to effect a deformation of the contact gel and interconnect the component and circuit pads through the said contact gel and the conductive pads of said film.

7. The assembly of claim 6 wherein the said contact gel has a thickness substantially greater than the thickness of said film to accommodate non-planarity of the said connector and circuit pads through axial deformation of the gel material.

8. The assembly of claim 6 wherein the said film has a thickness of on the order of 0.003 to 0.005 inches and the said gel has a thickness of on the order of 0.005 to 0.010 inches.

9. The assembly of claim 6 wherein the said gel is comprised of two bodies of material, separately deposited and cured on opposite side surfaces of said film.

10. The assembly of claim 6 wherein the said gel is comprised of a material deposited in an uncured state on each side surface of the said film.

11. The assembly of claim 6 wherein the said contact gel is characterized as having been deposited by silk-screening, stenciling or the like.

* * * * *